(12) United States Patent
Wright et al.

(10) Patent No.: US 6,710,453 B2
(45) Date of Patent: Mar. 23, 2004

(54) INTEGRATED CIRCUIT CONTAINING REDUNDANT CORE AND PERIPHERAL CONTACTS

(75) Inventors: Peter J. Wright, Sunnyvale, CA (US); Payman Zarkesh-Ha, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 11 days.

(21) Appl. No.: 10/462,524

(22) Filed: Jun. 16, 2003

(65) Prior Publication Data

US 2003/0211641 A1 Nov. 13, 2003

Related U.S. Application Data

(62) Division of application No. 10/061,518, filed on Feb. 1, 2002, now Pat. No. 6,617,181.

(51) Int. Cl.[7] .................. H01L 21/31; H01L 21/469
(52) U.S. Cl. ............... 257/773; 257/690; 257/734; 257/787; 438/17; 438/18; 438/106; 438/108; 438/127
(58) Field of Search ................. 257/678, 690, 257/692, 693, 734, 773, 787; 438/14, 15, 17, 18, 51, 55, 64, 106–108, 124–127

(56) References Cited

U.S. PATENT DOCUMENTS

| | | | |
|---|---|---|---|
| 6,274,390 B1 | * | 8/2001 | Akram et al. ............... 438/4 |
| 6,448,664 B1 | * | 9/2002 | Tay et al. ................ 257/780 |
| 6,472,732 B1 | * | 10/2002 | Terui ...................... 257/678 |
| 6,551,844 B1 | * | 4/2003 | Eldridge et al. ............ 438/4 |
| 2002/0027278 A1 | * | 3/2002 | Duesman et al. .......... 257/691 |
| 2002/0030270 A1 | * | 3/2002 | Nishizawa et al. ........ 257/724 |

* cited by examiner

Primary Examiner—Evan Pert
Assistant Examiner—Asopk Kumar Sarkar
(74) Attorney, Agent, or Firm—Luedeka Neely & Graham PC

(57) ABSTRACT

An integrated circuit having circuit structures, including at least one of logic elements and memory elements. A core is disposed at an interior portion of the integrated circuit. The core contains core power contacts and core ground contacts for providing electrical power to the circuit structures during functional operation of the integrated circuit. A peripheral is disposed at an edge portion of the integrated circuit. The peripheral contains signal contacts for sending and receiving electrical signals between the circuit structures and external circuitry. The peripheral also has peripheral power contacts and peripheral ground contacts for providing electrical power to the circuit structures during testing of the integrated circuit. The peripheral power contacts are redundant to at least some of the core power contacts, and the peripheral ground contacts are redundant to at least some of the core power contacts.

8 Claims, 3 Drawing Sheets

INTEGRATED CIRCUIT CONTAINING REDUNDANT CORE AND PERIPHERAL CONTACTS

CROSS-REFERENCE TO RELATED APPLICATIONS

This application is a divisional of application Ser. No. 10/061,518, filed Feb. 1, 2002, now U.S. Pat. No. 6,617,181.

FIELD

This invention relates to the field of integrated circuits. More particularly, this invention relates to integrated circuit design and testing.

BACKGROUND

Integrated circuits that operate at relatively higher clock speeds tend to require a greater amount of electrical current than integrated circuits that operate at relatively lower clock speeds. At the speeds at which many faster integrated circuits operate, the electrical characteristics of the current carrying structures within the integrated circuit tend to inhibit the desired operation of the integrated circuit.

For example, at high clock speeds, the voltage drop of the electrical signal between a power input point on the integrated circuit and the structures that are powered by the electrical signal tends to be too great. In such a circumstance, the voltage of the electrical signals provided to the structures is too low for proper operation of the structures, thus inhibiting reliable operation of the entire integrated circuit.

The voltage drop in such cases is related to the electrical current carried by the electrical conductor between the input point, or contact pad, and the structure, multiplied by the resistance of the electrical conductor. Thus, as the electrical current carried by the electrical conductor increases, and all other factors are held relatively constant, the voltage drop along the electrical conductor also increases, thereby resulting in the low voltage problem referred to above.

These problems have been overcome in part by changing the layout of faster integrated circuits from a wire bond design to a flip chip design. In a wire bond design all of the electrical connections to the integrated circuit, including signal, power, and ground, are made through bonding pads that are located around the peripheral edges of the integrated circuit. Thus, wire bond integrated circuits require relatively longer electrical conductors between the bonding pads and the structures of the integrated circuit that are disposed near the core of the integrated circuit. These longer electrical conductors tend to have a relatively greater total electrical resistance because of their length, and thus exhibit a higher voltage drop according to the formula as given above.

Flip chip integrated circuits, on the other hand, distribute bonding pads for the signal, power, and ground connections across the entire surface of the integrated circuit. In this manner, a given set of power and ground connections can provide electrical power to the structures of the integrated circuit that are disposed within a given proximity to the connections, and the problems associated with voltage drop are alleviated.

Unfortunately, there are other difficulties associated with flip chip integrated circuits. For example, testing an unpackaged flip chip integrated circuit, such as when the integrated circuit is in wafer form during the wafer sort testing, tends to be more difficult than testing a wire bond integrated circuit. One reason for this is that the probe cards required to test a flip chip integrated circuit at wafer sort tend to be more difficult to manufacture and maintain, and thus cost more both in the initial purchase and also over the life of the probe card. Testing wire bond integrated circuits, on the other hand, is relatively easier, and thus cheaper.

What is needed, therefore, is an integrated circuit design that overcomes the problems mentioned above.

SUMMARY

The above and other needs are met by an integrated circuit having circuit structures, including at least one of logic elements and memory elements. A core is disposed at an interior portion of the integrated circuit. The core contains core power contacts and core ground contacts for providing electrical power to the circuit structures during functional operation of the integrated circuit.

A peripheral is disposed at an edge portion of the integrated circuit. The peripheral contains signal contacts for sending and receiving electrical signals between the circuit structures and external circuitry. The peripheral also has peripheral power contacts and peripheral ground contacts for providing electrical power to the circuit structures during testing of the integrated circuit. The peripheral power contacts are redundant to at least some of the core power contacts, and the peripheral ground contacts are redundant to at least some of the core power contacts.

In this manner, the integrated circuit is preferably tested at wafer sort using the signal contacts, power contacts, and ground contacts disposed in the peripheral of the integrated circuit, thus avoiding the expense and other problems associated with flip chip probe cards. However, the integrated circuit is preferably packaged using the power contacts and ground contacts in the core of the integrated circuit, thus avoiding the problems associated with voltage drops between circuit structures disposed in the core of the integrated circuit and power contacts and ground contacts disposed in the peripheral of the integrated circuit.

In various preferred embodiments of the invention, the integrated circuit further comprises packaging for protecting the integrated circuit, and package electrical contacts for making electrical connections to the signal contacts, the core power contacts, and the core ground contacts. In a first alternate embodiment, the package electrical contacts do not make electrical connections to the peripheral power contacts and the peripheral ground contacts. In a second alternate embodiment, the package electrical contacts do make at least one electrical connection to the peripheral power contacts and the peripheral ground contacts. In one embodiment the peripheral power contacts are redundant to all of the core power contacts, and the peripheral ground contacts are redundant to all of the core power contacts.

In further embodiments, signal contacts are also disposed in the core of the integrated circuit. In another embodiment the functional operation of the integrated circuit is conducted at a functional clock speed and the testing of the integrated circuit is conducted at a test clock speed, and the functional clock speed of the integrated circuit is higher than the test clock speed of the integrated circuit. In a most preferred embodiment, the functional operation of the integrated circuit is conducted at a functional clock speed of at least about one hundred megahertz, and the testing of the integrated circuit is conducted at a test clock speed of no more than about ten megahertz.

According to another aspect of the invention there is provided a method of fabricating an integrated circuit. Circuit structures are fabricated, including at least one of logic elements and memory elements. Core power contacts and core ground contacts are fabricated in a core, disposed at an interior portion of the integrated circuit. Signal contacts, peripheral power contacts, and peripheral ground contacts are fabricated in a peripheral, disposed at an edge portion of the integrated circuit. The peripheral power contacts are redundant to at least some of the core power contacts, and the peripheral ground contacts are redundant to at least some of the core power contacts.

The integrated circuit is tested by providing electrical power to the circuit structures with the peripheral power contacts and the peripheral ground contacts. Electrical signals are sent and received between the circuit structures and external circuitry with the signal contacts.

The integrated circuit is packaged by making electrical connections to the core power contacts and the core ground contacts. These electrical connections are for providing electrical power to the circuit structures during functional operation of the integrated circuit. Electrical connections are also made to the signal contacts, for sending and receiving electrical signals between the circuit structures and external circuitry during functional operation of the integrated circuit. The integrated circuit is enclosed in a package to protect the integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
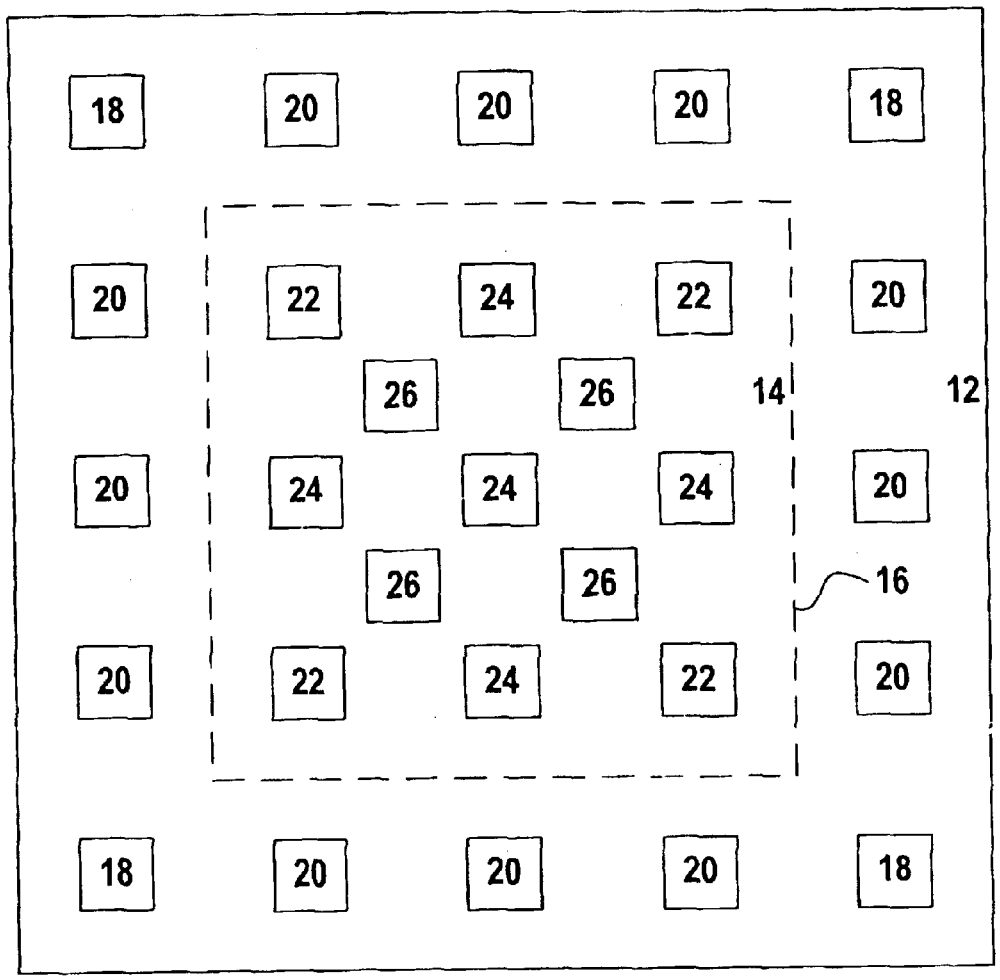
FIG. 1 is a top plan view of an integrated circuit according to a preferred embodiment of the present invention.

With reference now to FIG. 1, there is depicted a top plan view of an integrated circuit 10 according to a preferred embodiment of the present invention. The integrated circuit 10 has a peripheral 12 disposed at an edge portion of the integrated circuit 10. The integrated circuit 10 also has a core 14 disposed at an interior portion of the integrated circuit 10. The peripheral 12 and the core 10 are separated in FIG. 1 by boundary line 16, which is presented only for clarity in understanding the invention, and which is typically not physically present in tangible embodiments of the integrated circuit 10.

Disposed in the core 14 of the integrated circuit 10 are core power contacts and core ground contacts, all generally referred to with the reference number 22. It is appreciated that in actual implementations of the integrated circuit 10, some of the contacts 22 are separate core power contacts and some of the contacts 22 are separate core ground contacts. However, since it is not material to the present invention that the contacts 22 be designated as one of either a core power contact or a core ground contact, they are not so distinguished in this description, which preferably aids in understanding the invention by not encumbering the description with inessential details.

Also disposed in the core 14 of the integrated circuit 10 as depicted in FIG. 1 are signal contacts 24. It is appreciated that signal contacts 24 are not found in the core 14 of the integrated circuit 10 in all embodiments of the invention. As depicted in FIG. 1, the core 14 of the integrated circuit 10 includes a three by three rectilinear matrix of nine contacts, including core power contacts 22, core ground contacts 22, and signal contacts 24. It is appreciated that this number of contacts, their arrangement, and their allocation between the three different kinds of contacts is by way of example and not limitation. In alternate embodiments of the invention, the matrix may be of a higher order or lesser order than three, may not have the same number of rows as it has columns, may not be rectilinear or even disposed in rows and columns, and may be allocated between the core power contacts 22, core ground contacts 22, and signal contacts 24 in different ratios than that as presented in FIG. 1.

Disposed in the peripheral 12 of the integrated circuit 10 are peripheral power contacts and peripheral ground contacts, all generally referred to with the reference number 18. It is appreciated that in actual implementations of the integrated circuit 10, and similar to that as described above in regard to the core 14, some of the contacts 18 are separate peripheral power contacts and some of the contacts 18 are separate peripheral ground contacts. These different contacts are referenced with a single reference number herein for the same reasons as given above in regard to the core power contacts 22 and the core ground contacts. Also disposed in the peripheral 12 of the integrated circuit 10 are signal contacts 20. Preferably, all embodiments of the invention have signal contacts 20 disposed in the peripheral 12 of the integrated circuit 10, for reasons as described with more particularity hereafter.

As depicted in FIG. 1, the peripheral 12 of the integrated circuit 10 contains a single ring of contacts around the circumference of the integrated circuit 10. It is appreciated that this specific depiction of the peripheral 12 is by way of example and not limitation. In alternate embodiments of the invention, there may be a greater number of circumferential rings of contacts in the peripheral 12 of the integrated circuit 10, and the number of such rings may not be the same on all sides of the integrated circuit 10. For example, the number of circumferential rings may be three on two sides of the integrated circuit 10, and one on the other two sides of the integrated circuit 10. Obviously, other combinations and numbers of circumferential rings are also anticipated.

Further, the contacts within the peripheral 12 of the integrated circuit 10 may not be disposed in a linear fashion, such as that depicted in FIG. 1, but may alternately be disposed in a serpentine arrangement, in blocks or clusters, or in other such layouts as may be preferentially dictated by other competing design criteria. However, in the most preferred embodiment there is a single circumferential ring of contacts in the peripheral 12 of the integrated circuit 10, as depicted in FIG. 1, which circumferential ring of contacts preferable includes a far greater number of contacts than that as depicted.

Also disposed in the core 14 of the integrated circuit 10 as depicted in FIG. 1 are circuit structures 26. The circuit structures 26 represent functional elements of the integrated circuit 10, including at least one of memory elements and logic elements. The circuit structures 26 draw electrical power from power contacts and ground contacts as described in more detail below, and send and receive electrical signals through signal contacts, as also described in more detail below. In alternate embodiments of the invention there are also circuit structures 26 disposed in the peripheral 12 of the integrated circuit 10.

Although the circuit structures 26 are depicted in FIG. 1 as disposed within a rectilinear matrix of a given order, it is appreciated that this is by way of example and not by way of limitation. In alternate embodiments of the invention, the circuit structures 26 are not limited to a rectilinear array, or to an array of any given order. Thus, the number and arrangement of circuit structures 26 as depicted in FIG. 1 is representational, and is not to be literally interpreted.

As mentioned above, there tend to be problems associated with probing the contacts in the peripheral 14 of the integrated circuit 10, such as during wafer sort operations. Further, there tend to be problems associated with powering circuit structures 26 in the core 14 of the integrated circuit 10 with peripheral power contacts 18 and peripheral ground contacts 18 disposed in the peripheral 12 of the integrated circuit 10.

Therefore, these problems are overcome according to the present invention by probing the integrated circuit 10 using the peripheral power contacts 18 and the peripheral ground contacts 18 in the peripheral 12 of the integrated circuit 10, and packaging the integrated circuit 10 using the core power contacts 22 and the core ground contacts 22 in the core 14 of the integrated circuit 10. Thus, the peripheral power contacts 18 and the peripheral ground contacts 18 in the peripheral 12 of the integrated circuit 10 are preferably probed during testing of the integrated circuit 10, and the core power contacts 22 and the core ground contacts 22 in the core 14 of the integrated circuit 10 are preferably used during functional operation of the integrated circuit 10.

Figure 2:
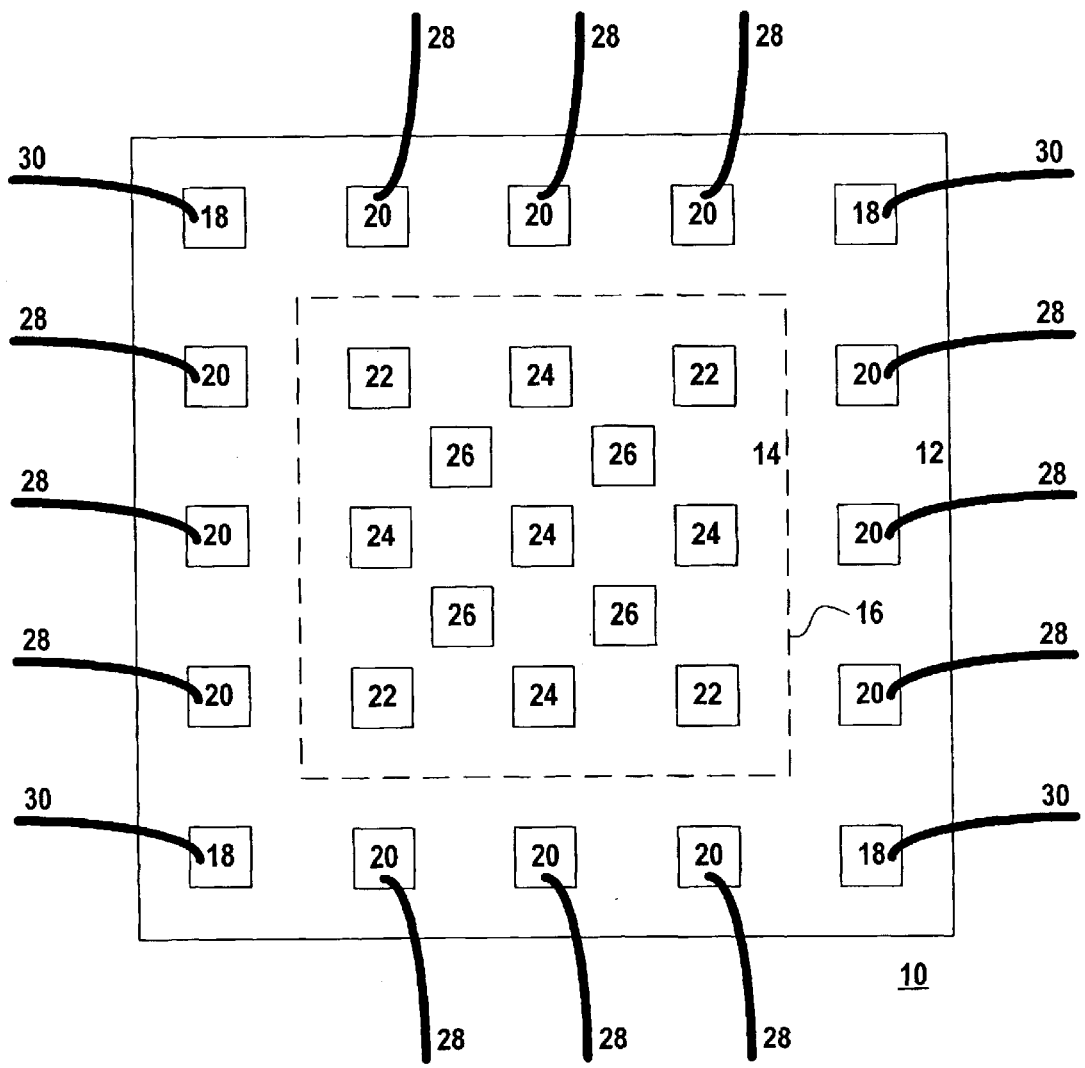
FIG. 2 is a top plan view of the integrated circuit of FIG. 1, depicting electrical connections made during testing of the integrated circuit.

Referring now to FIG. 2, there is depicted the integrated circuit 10, which is being probed, such as during a wafer sort operation, with probes 28 and 30. The probes 28 are preferably making electrical connections with the signal contacts 20, and the probes 30 are preferably making electrical connections with the peripheral power contacts 18 and the peripheral ground contacts 18. Thus, all of the electrical connections established for testing are preferably accomplished through the contacts disposed in the peripheral 12 of the integrated circuit 10. Thus, the problems with probing contacts disposed in the core 14 of the integrated circuit 10 are thereby overcome.

As mentioned above, there are typically problems associated with providing power and ground through peripheral contacts. However, these problems are also overcome in the present invention by testing the integrated circuit 10 at a test clock speed that is preferably in the neighborhood of no more than about ten megahertz. At this clock speed, the current carried by the electrical conductors between the peripheral power contacts 18 and the peripheral ground contacts 18 in the peripheral 12 of the integrated circuit 10 is at a low enough value that the voltage drop between the contacts and the circuit structures 26 in the core 14 of the integrated circuit 10 is not so great as to impede the operation of the circuit structures 26 or make the overall functioning of the integrated circuit 10 unstable.

In a most preferred embodiment of the invention, the peripheral power contacts 18, the peripheral ground contacts 18, and the signal contacts 20 disposed in the peripheral 12 of the integrated circuit 10 provide electrical connections to all of the circuit structures 26 of the integrated circuit 10, regardless of whether such circuit structures 26 are disposed in the core 14 or the peripheral 12.

Alternately, the peripheral power contacts 18, the peripheral ground contacts 18, and the signal contacts 20 disposed in the peripheral 12 of the integrated circuit 10 provide electrical connections to a subset of the circuit structures 26, which is that subset of the circuit structures 26 that are to be tested during a probing operation, such as wafer sort, with the balance of the circuit structures 26 having electrical connections to the core power contacts 22, the core ground contacts 22, and the signal contacts 24 disposed in the core 14 of the integrated circuit 10.

In yet a further alternate embodiment, the peripheral power contacts 18 and the peripheral ground contacts 18 provide electrical connections to a subset of the circuit structures 26, but the signal contacts 20 in the peripheral 12 of the integrated circuit 10 provide electrical connections to all of the circuit structures 26, regardless of whether such circuit structures 26 are disposed in the core 14 or the peripheral 12.

Figure 3:
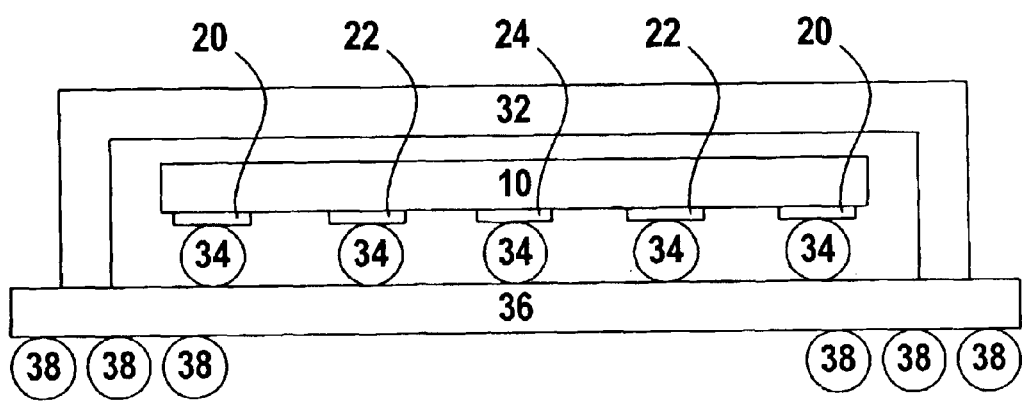
FIG. 3 is a cross sectional view of the integrated circuit of FIG. 1, depicting packaging and electrical connections made for use during functional operation of the integrated circuit.

Referring now to FIG. 3, there is depicted a cross sectional view of the integrated circuit of FIG. 1, depicting packaging and electrical connections made for use during functional operation of the integrated circuit 10. By functional operation it is meant that the integrated circuit 10 is operated in that manner for which it was designed and fabricated. Preferably, functional operation of the integrated circuit 10 is performed at a functional clock speed that is higher than the test clock speed. Most preferably the functional clock speed is in the neighborhood of at least about one hundred megahertz. At a clock speed of this magnitude, the voltage drop through relatively longer electrical connections, such as those that are formed between the circuit structures 26 in the core 14 of the integrated circuit 10 and the peripheral power contacts 18 and the peripheral ground contacts 18 formed in the peripheral 12 of the integrated circuit 10, tends to be too great for reliable operation of the integrated circuit 10.

Thus, according to the present invention, the circuit structures 26 disposed in the core 14 of the integrated circuit 10 are preferably electrically connected to the core power contacts 22 and the core ground contacts 22 disposed within the core 14 of the integrated circuit 10. In alternate embodiments, the circuit structures 26 disposed in the core 14 of the integrated circuit 10 are also electrically connected to the signal contacts 24 disposed in the core 14 of the integrated circuit 10. Thus, the peripheral power contacts 18 are preferably redundant to at least some of the core power contacts 22, and the peripheral ground contacts 18 are preferably redundant to at least some of the core ground contacts 22. In this manner, the core power contacts 22 and the core ground contacts 22 do not need to be probed during wafer sort to energize and test at least some of the circuit structures 26 disposed in the core 14 of the integrated circuit 10.

Packaging for the integrated circuit 10 preferably includes a package substrate 36, which is electrically connected to the integrated circuit 10 such as through solder bumps 34. The package substrate 36 is then electrically connected to additional external circuitry through electrical connections such as solder balls 38. The integrated circuit 10 is preferably protected such as by a lid or other encapsulant 32.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. An integrated circuit, comprising:

circuit structures, including at least one of logic elements and memory elements, a core disposed at an interior portion of the integrated circuit, the core containing core power contacts and core ground contacts for providing electrical power to the circuit structures during functional operation of the integrated circuit, and a peripheral disposed at an edge portion of the integrated circuit, the peripheral containing signal contacts for sending and receiving electrical signals between the circuit structures and external circuitry, and peripheral power contacts and peripheral ground contacts for providing electrical power to the circuit structures during testing of the integrated circuit, where the peripheral power contacts are redundant to at least some of the core power contacts, and the peripheral ground contacts are redundant to at least some of the core power contacts.

2. The integrated circuit of claim 1, further comprising:

packaging for protecting the integrated circuit, and package electrical contacts for making electrical connections to the signal contacts, the core power contacts, and the core ground contacts, but not to the peripheral power contacts and the peripheral ground contacts.

3. The integrated circuit of claim 1, further comprising:

packaging for protecting the integrated circuit, and package electrical contacts for making electrical connections to the signal contacts, the core power contacts, the core ground contacts, the peripheral power contacts, and the peripheral ground contacts.

4. The integrated circuit of claim 1, further comprising signal contacts in the core of the integrated circuit.

5. The integrated circuit of claim 1, wherein the peripheral power contacts are redundant to all of the core power contacts, and the peripheral ground contacts are redundant to all of the core power contacts.

6. The integrated circuit of claim 1, wherein the functional operation of the integrated circuit is conducted at a functional clock speed and the testing of the integrated circuit is conducted at a test clock speed, and the functional clock speed of the integrated circuit is higher than the test clock speed of the integrated circuit.

7. The integrated circuit of claim 1, wherein the functional operation of the integrated circuit is conducted at a functional clock speed of at least about one hundred megahertz.

8. The integrated circuit of claim 1, wherein the testing of the integrated circuit is conducted at a test clock speed of no more than about ten megahertz.

* * * * *